(12) United States Patent
Hsu

(10) Patent No.: US 7,737,714 B2
(45) Date of Patent: Jun. 15, 2010

(54) PROBE ASSEMBLY ARRANGEMENT

(75) Inventor: Tseng-Yang Hsu, San Marino, CA (US)

(73) Assignee: WinMEMS Technologies Holdings Co., Ltd., Taipei (TW)

( * ) Notice: Subject to any disclaimer, the term of this patent is extended or adjusted under 35 U.S.C. 154(b) by 0 days.

(21) Appl. No.: 12/265,592

(22) Filed: Nov. 5, 2008

(65) Prior Publication Data
US 2010/0109698 A1 May 6, 2010

(51) Int. Cl.
G01R 31/02 (2006.01)
(52) U.S. Cl. .................. 324/762; 324/754; 439/862; 439/66
(58) Field of Classification Search ......... 324/754–765; 439/66, 862
See application file for complete search history.

(56) References Cited

U.S. PATENT DOCUMENTS

| | | | |
|---|---|---|---|
| 4,773,877 A | | 9/1988 | Kruger et al. |
| 5,100,338 A | * | 3/1992 | Lu .............................. 439/326 |
| 5,286,208 A | * | 2/1994 | Matsuoka .................... 439/72 |
| 5,798,283 A | | 8/1998 | Montague et al. |
| 6,672,875 B1 | | 1/2004 | Mathieu et al. |
| 6,784,680 B2 | | 8/2004 | Haga et al. |
| 6,965,245 B2 | | 11/2005 | Kister et al. |
| 7,048,548 B2 | | 5/2006 | Mathieu et al. |
| 7,078,921 B2 | | 7/2006 | Haga et al. |
| 7,151,385 B2 | | 12/2006 | Hirata et al. |
| 7,156,706 B2 | * | 1/2007 | Brown et al. ................. 439/862 |
| 7,190,179 B2 | | 3/2007 | Haga et al. |
| 7,285,966 B2 | * | 10/2007 | Lee et al. ..................... 324/754 |
| 7,377,788 B2 | * | 5/2008 | Hasegawa ..................... 439/66 |
| 7,474,110 B2 | * | 1/2009 | Mochizuki et al. .......... 324/754 |
| 7,567,089 B2 | | 7/2009 | Chen et al. |
| 7,586,321 B2 | * | 9/2009 | Hirakawa et al. ........... 324/762 |
| 2006/0192581 A1 | | 8/2006 | Lee |
| 2007/0290698 A1 | * | 12/2007 | Mochizuki et al. .......... 324/754 |
| 2008/0007282 A1 | * | 1/2008 | Hasegawa et al. ........... 324/757 |
| 2008/0036449 A1 | * | 2/2008 | Kimoto ....................... 324/149 |
| 2008/0111573 A1 | | 5/2008 | Chen et al. |
| 2008/0184559 A1 | | 8/2008 | Soma et al. |

* cited by examiner

Primary Examiner—Ha Tran T Nguyen
Assistant Examiner—Arleen M Vazquez
(74) Attorney, Agent, or Firm—Blakely Sokoloff Taylor & Zafman, LLP

(57) ABSTRACT

A probe array is assembled on a probe card platform. Each of the probes in the probe array has a probe base that includes a gripping handle. The probe bases have two or more different shapes. The probe bases of different shapes are interleaved such that any two adjacent probes on the platform have probe bases of different shapes. The arrangement of the probes increases effective spacing between the probes to facilitate the maneuvering of a handling tool.

15 Claims, 14 Drawing Sheets

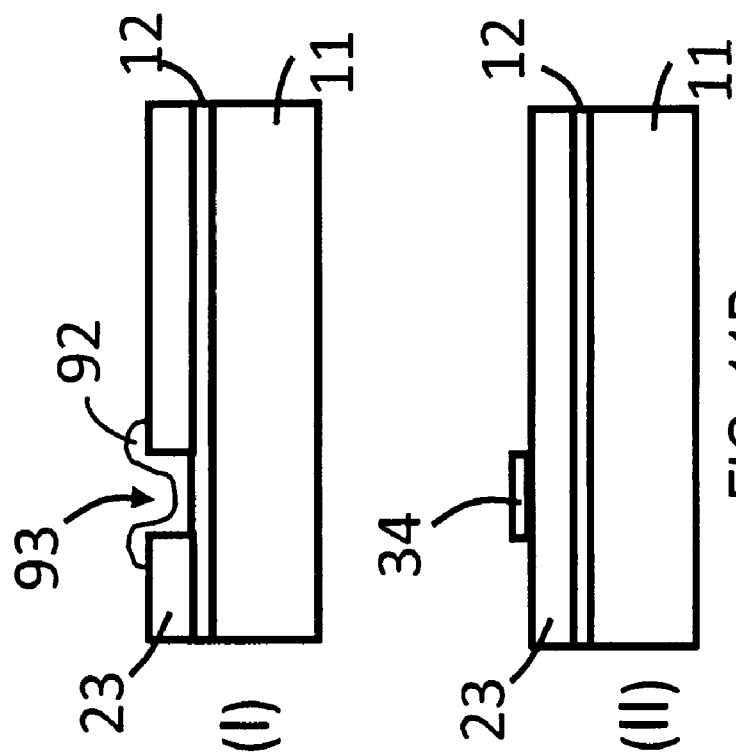
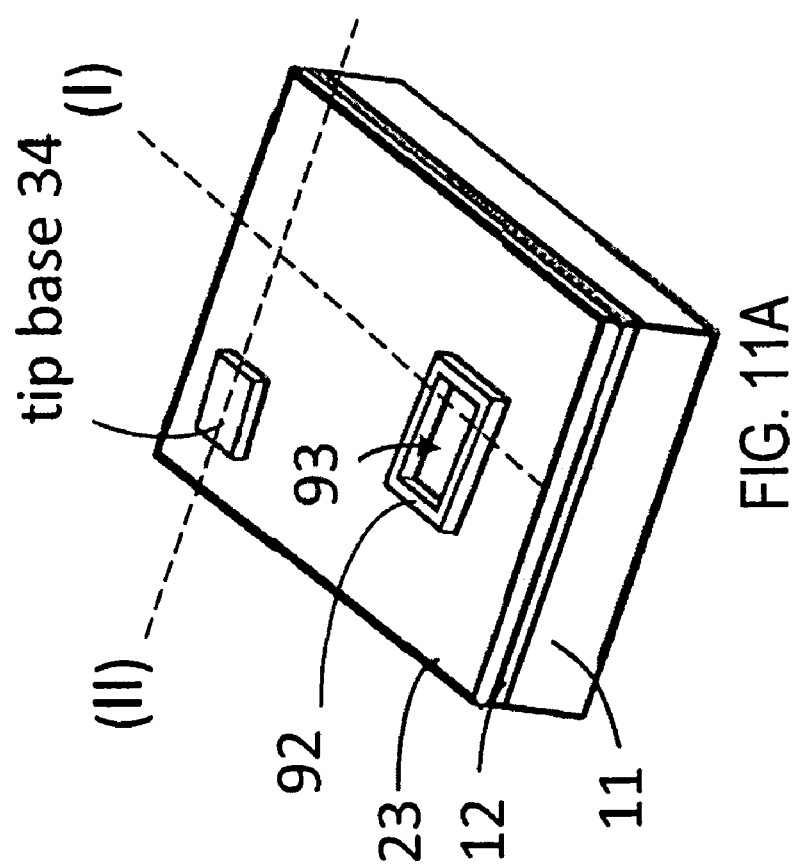
FIG. 11A
FIG. 11B

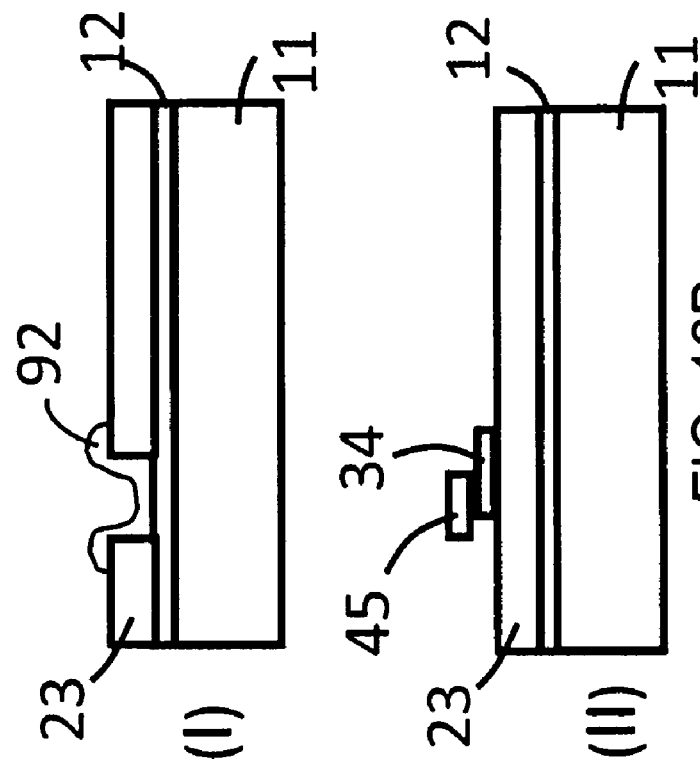
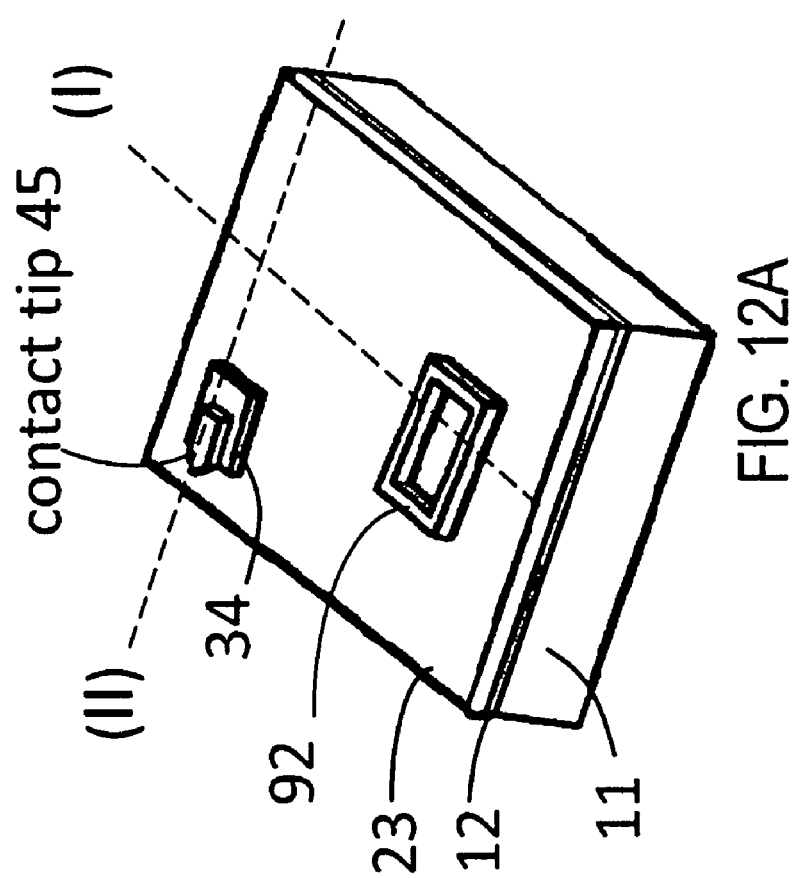
FIG. 12A
FIG. 12B

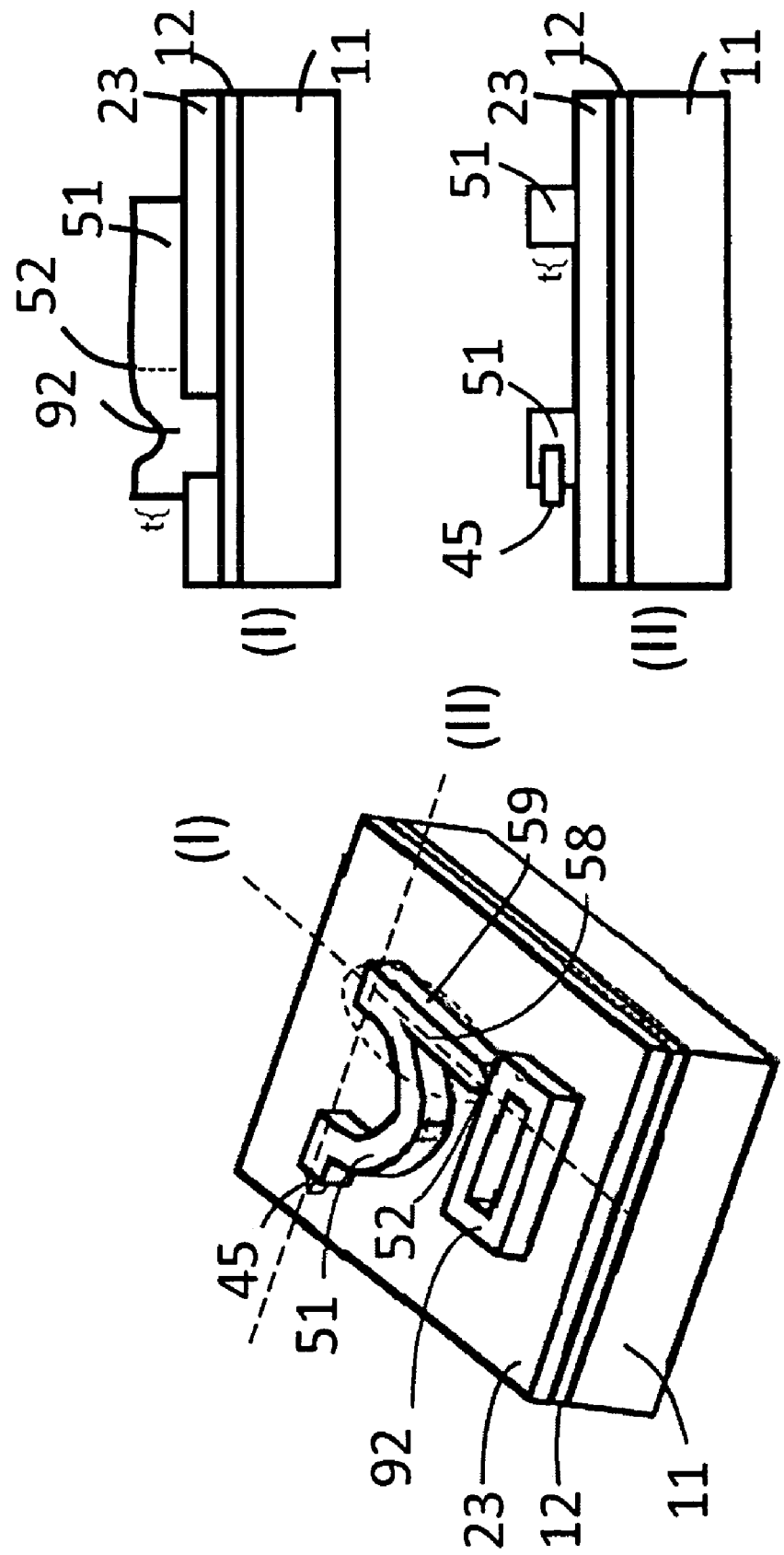

PROBE ASSEMBLY ARRANGEMENT

FIELD OF THE INVENTION

At least one embodiment of the present invention pertains to Micro-Electro-Mechanical Systems (MEMS), and more particularly, to the assembly of an array of MEMS probes.

BACKGROUND

Micro-Electro-Mechanical Systems (MEMS) is the integration of mechanical elements, sensors, actuators, and electronics on a common substrate, such as a silicon substrate, through microfabrication technology. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electromechanical devices.

A MEMS device includes small structures with dimensions in the micrometer scale (one millionth of a meter). Significant portions of the MEMS technology have been adopted from integrated circuit (IC) technology. For instance, similar to ICs, MEMS structures are, in general, realized in thin films of materials and patterned with photolithographic methods. Moreover, similar to ICs, MEMS structures are, in general, fabricated on a wafer by a sequence of deposition, lithography and etching.

With the increasing complexity of MEMS structures, the fabrication process of a MEMS device also becomes increasingly complex. For example, an array of MEMS probes can be assembled on an application platform of a probe card. A probe card is an interface between an electronic test system and a semiconductor wafer under test. A probe card provides an electrical path between the test system and the circuitry on the wafer, thereby enabling the testing and validation of the circuitry at the wafer level, before the chips on the wafer are diced and packaged.

A probe card typically contains hundreds to tens of thousands of probes on a single platform. Therefore, the spacing between two neighboring probes is usually in the range of 0.1 mm or less. During the probe assembly process, the tight spacing between the probes makes it difficult for a probe handling tool to grab, position and place the probes. Probe handling tools generally have dimensions comparable to or wider than the probe spacing. If the handling tool is wider than the available spacing between the probes, the handling tool cannot easily move between the probes during probe assembly without touching an adjacent probe that is already bonded to the surface of the platform. It is to be noted that a probe handling tool can be a mechanical gripper, a vacuum gripper, a magnetic gripper, or any precision tool that is capable of probe grabbing.

BRIEF DESCRIPTION OF THE DRAWINGS

Embodiments are illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

FIGS. 11A-11B illustrate the formation of a tip base and a frame on the first sacrificial layer.

FIGS. 12A-12B illustrate the formation of a contact tip of the probe.

FIGS. 13A-13B illustrate the formation of a probe body.

DETAILED DESCRIPTION

Figure 1:
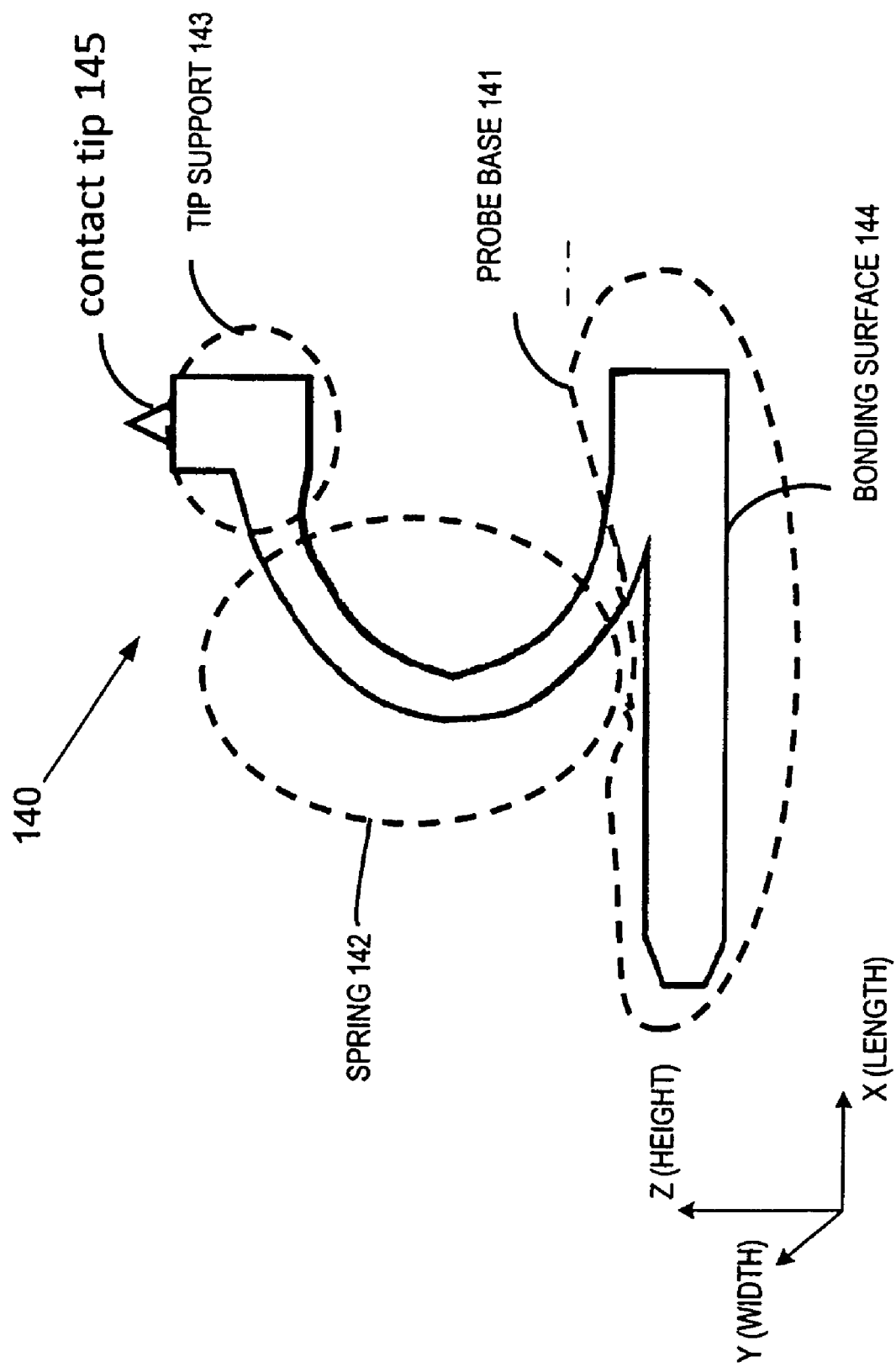
FIG. 1 illustrates an embodiment of a probe.

An arrangement of a probe array assembly on a probe card platform is described. In the probe array assembly, each of the probes has a probe base that includes a gripping handle. The probe bases have two or more different shapes. The probe bases of different shapes are interleaved such that any two adjacent probes on the platform have probe bases of different shapes. The arrangement increases effective spacing between the probes to facilitate the maneuvering of a handling tool.

As a result of interleaving probes of different shapes, the gripping handles (also referred to as the tool handling parts) of the adjacent probes on the probe card platform are not aligned. Instead, the gripping handles of the probes, at least in part, form a staggered or zigzag pattern. This arrangement creates more room for a handling tool to operate. Thus, a handling tool can more easily handle (e.g., pick up or place) the probes using the space between the tool handling parts and, at the same time, avoid unintentionally touching or displacing an adjacent probe that is already bonded to the surface of the platform.

The probes described herein are fabricated using Micro-Electro-Mechanical Systems (MEMS) technology. The probes assembly described herein is produced by a pick-and-place process. In a pick-and-place process, MEMS probes ("probes") are individually detached ("picked") from a substrate, and then attached ("placed") to an application platform in an unpackaged state. This "pick-and-place" technique not only improves the yield of the probes, but also greatly increases the flexibility with respect to how the probes are fabricated and used. For example, the array of probes may be detached from the substrate concurrently, or one or more parts at a time. Each of the probes fabricated from the same substrate may be attached to the same or different application platforms. Further, a probe card may include one or more MEMS probes fabricated from one or more substrates. The MEMS probes attached to a probe card may have different orientations, shapes, sizes and materials. The location of the probes on the probe card can be customized.

As the probes are fabricated on a substrate different from the platform used for the final application, yield of the individual probes does not directly affect the yield of the final product. A selection process of acceptable probes may be performed before the probes are assembled on the probe cards. Defective probes may be discarded before the attachment process, or left on the substrate.

The term "substrate" herein refers to the substrate used in the probe fabrication process, without involvement in the operations of the probes and the probe card. Examples of a substrate for fabricating MEMS probes include, but are not limited to, ceramics, glasses, metal plates, plastic plates, and semiconductor (e.g., silicon (Si)) wafers. A non-silicon substrate, compared to a Si-based substrate, offers a larger number of standard sizes and is available as a thicker and non-circular standard substrate. Further, some non-silicon substrates are inert to most chemicals used during fabrication processes. Most substrates, including a Si-based substrate, can be processed with the MEMS probes thereon. Processed materials on the substrates can be later removed or dissolved without damaging the substrates. Therefore, the substrate for fabricating MEMS probes, as described herein, is a "reusable substrate," unless otherwise indicated. A reusable substrate can be reused for a next batch of MEMS probes fabrication after the MEMS probes are detached therefrom and residual substances are removed.

The term "application platform" (also referred to as "platform" or "probe card platform") herein refers to a part of a probe card which provides a platform to which the probes are attached, and electrically connects one or more (e.g., each) of the probes to a printed circuit board (PCB) that interfaces an electronic test system. An application platform may include, but is not limited to, semiconductor, glass, ceramics (e.g., low-temperature co-fired ceramics (LTCC), high-temperature co-fired ceramics (HTCC)), metal, other dielectric materials, organic materials, or any combinations of the above. In addition to MEMS probes, an application platform may include components such as electrical connection, electrical contact, electrical isolation, electrical grounding, integrated circuit (IC) module, application specific IC (ASIC) module, dielectric patterning, conducting opening definition, mechanical support, mechanical protection, thermal conduction, electrostatic discharge (ESD) protection, confinement for parts, and wire bonding pads.

FIG. 1 illustrates an embodiment of a probe 140 which includes a contact tip 145 and a probe body. The probe body further includes three main portions, a probe base 141, a spring 142 and a tip support 143. Probe base 141 mechanically supports the rest of the probe structure and includes a bonding surface 144 at the bottom for attachment to a conductive strip or pad on the platform of a probe card. Spring 142 is designed to have a spring constant as specified by a customer's requirements. Spring 142 reacts with a buckling force to a pressure applied on contact tip 145. Tip support 143 supports contact tip 145 to form a contact to the device-under-test (DUT). All of the three portions (141, 142 and 143) and contact tip 145 can be customized to satisfy the requirements of different applications.

Probe base 141 can vary in design to meet the requirements of different applications. The shape of probe base 141, as viewed in the X-Z plane, can be customized to satisfy the requirements of different applications. For example, probe base 141 can have a recess or a protruding area to facilitate the handling by a tool (e.g., a mechanical gripper that grips a probe by the probe base). The maneuverability of the tool is dependent on the spacing between the adjacent probes; more specifically, the spacing between the adjacent probe bases (as a probe is usually picked up by a tool from its base). The term "pitch" refers to the distance between the longitudinal axes of two adjacent probe bases (or equivalently, the distance between the same sides of two adjacent probe bases, as the probes described herein have the same width in the Y-dimension). Thus, the spacing between any two adjacent probe bases is equal to (pitch)−(probe width). A tight spacing makes it difficult for a tool to maneuver. To increase the spacing, probes that are assembled together on an application platform can have probe bases of different shapes.

Figure 2:
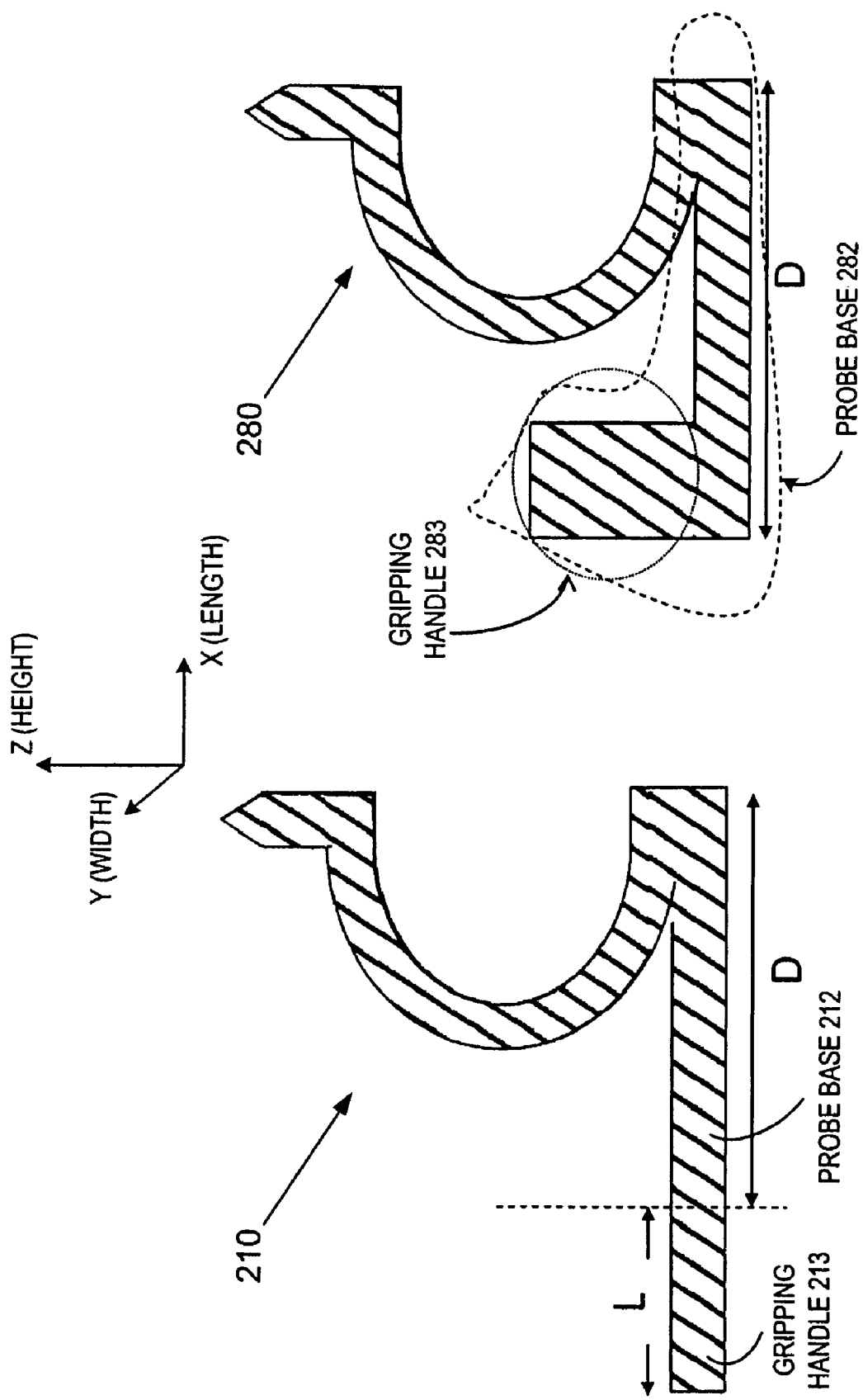
FIG. 2 illustrates an embodiment of two probes having probe bases of different shapes.

FIG. 2 shows an embodiment of a probe 210 and a probe 280. Probe 210 has a probe base 212 of length (D+L), including a gripping handle 213 of length L that extends longitudinally toward a distal end (the end that is not connected to the spring) of probe base 212. Probe 280 has a probe base 282 of length D, including a gripping handle 283 protruding perpendicularly, with respect to the top surface of the base (the surface on the X-Y plane), at or near the distal end of probe base 282. Gripping handle 283 can have a length less than L (in the X-dimension). Although shown as a rectangle, gripping handles 213 and 283 can have any shape in the X-Z plane, such as a rectangle with rounded corners, a round shape, a triangle, a trapezoid, etc.

In this embodiment, gripping handle 283 is "higher" but with a "shorter" length and gripping handle 213 is "lower" but with a "longer" length, as viewed in the X-Z plane. A gripper can be used to grab the probes, by its gripping handle, to a location for bonding, assembly or repair. In one embodiment, probe 280 (with the "higher" but "shorter" gripping handle 283) can be grabbed and bonded to a platform first. Subsequently, probe 210 (with the "lower" but "longer" gripping handle 213) can be grabbed and bonded to the platform next to probe 280.

Figure 3:
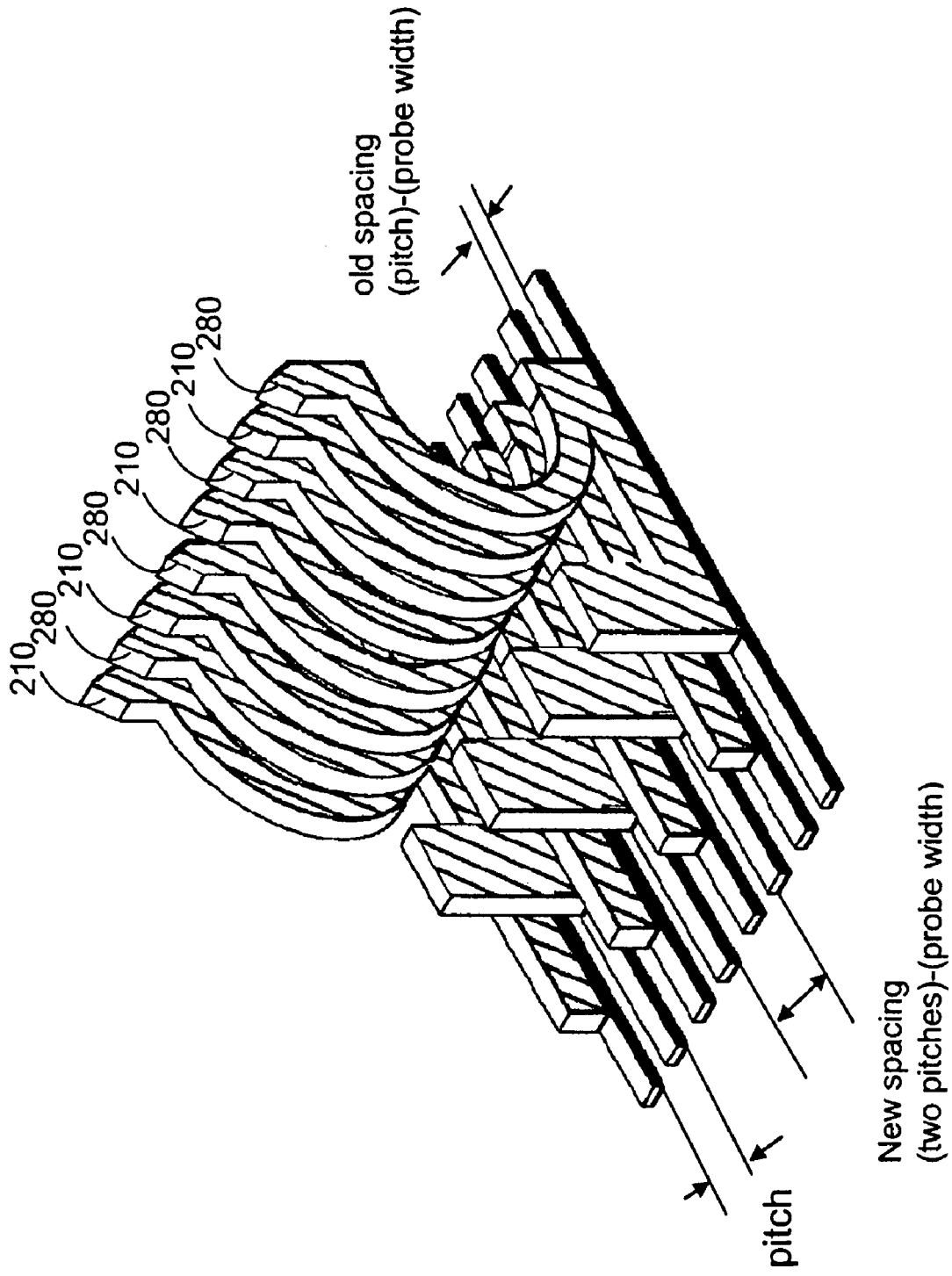
FIG. 3 illustrates an embodiment of a probe array assembly using the two probes of FIG. 2.

FIG. 3 shows an example of an array of probes formed by interleaving multiple probes 210 and probes 280. Probes 210 and probes 280 are placed in an alternating order. As a result, the effective spacing is the spacing between two nearest gripping handles 213=the spacing between two nearest gripping handles 283=(two pitches)−(probe width). Thus, by interleaving the probes having probe bases of different shapes, the effective spacing between the adjacent probes (as determined by the spacing between two nearest gripping handles of the same kind) is increased by a pitch width.

Figure 4:
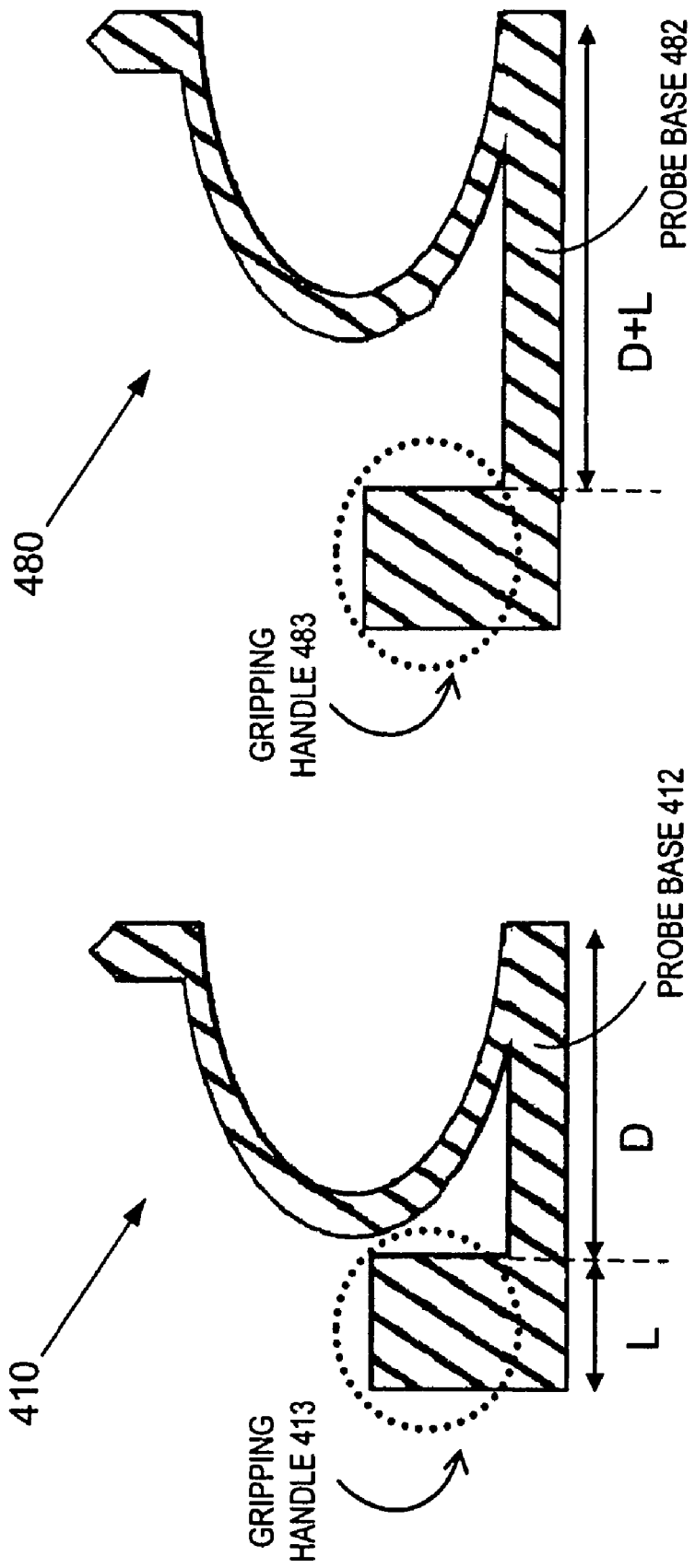
FIG. 4 illustrates another embodiment of two probes having probe bases of different shapes.

FIG. 4 shows another embodiment of a pair of probes that have probe bases of different shapes. Two probes 410 and 480 are shown to both have a perpendicularly protruding section at the distal end of the probe bases, but one probe base has an extra length. Probe 410 has a probe base 412 that includes a low section of length D and a high section of length L at the distal end of the base. The protruding part of the high section is a gripping handle 413. Probe 480 has a probe base 482 that includes a low section of length (D+L) and a high section at the distal end of the base. The protruding part of the high section is a gripping handle 483. Gripping handle 483 can have a length equal to or different from L. When interleaving multiple probes 410 and probes 480 to form a probe array on a platform, gripping handles 413 and 483 form a zigzag pattern. As a result, similar to the example shown in FIG. 3, the effective spacing between the adjacent probes is increased by a pitch width.

Figure 5:
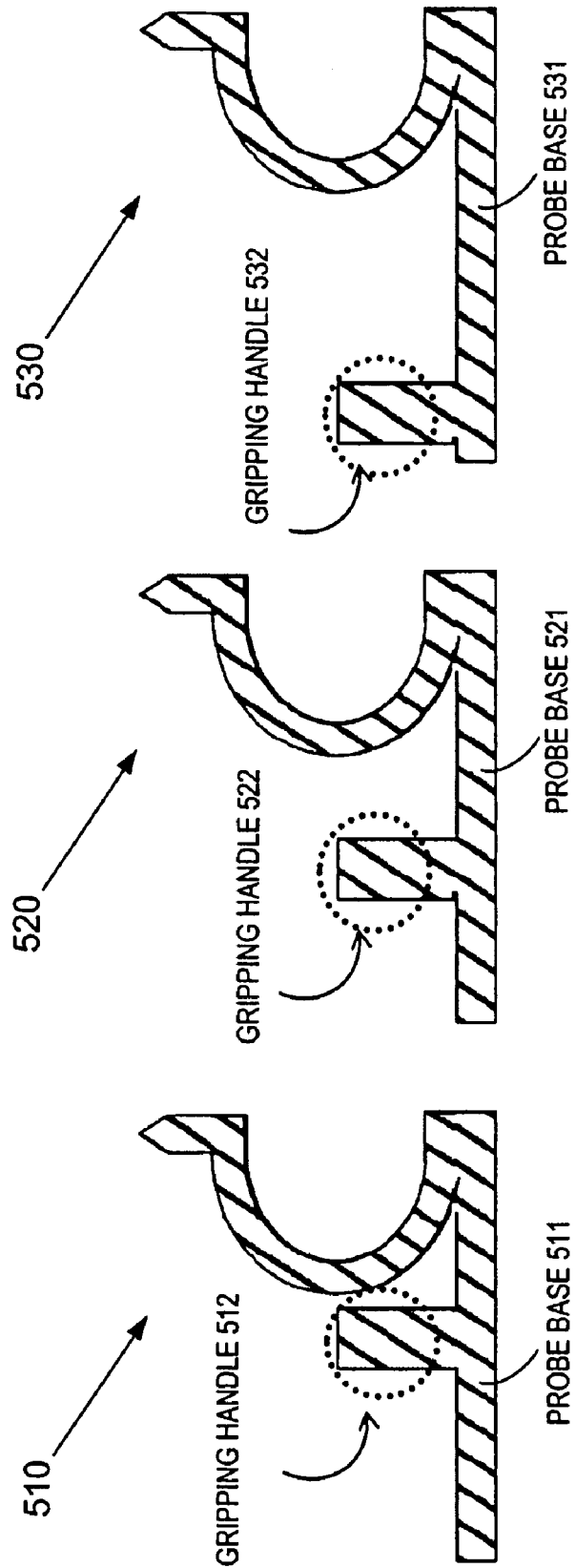
FIG. 5 illustrates an embodiment of three probes that have gripping handles in different locations of the probe bases.
Figure 6:
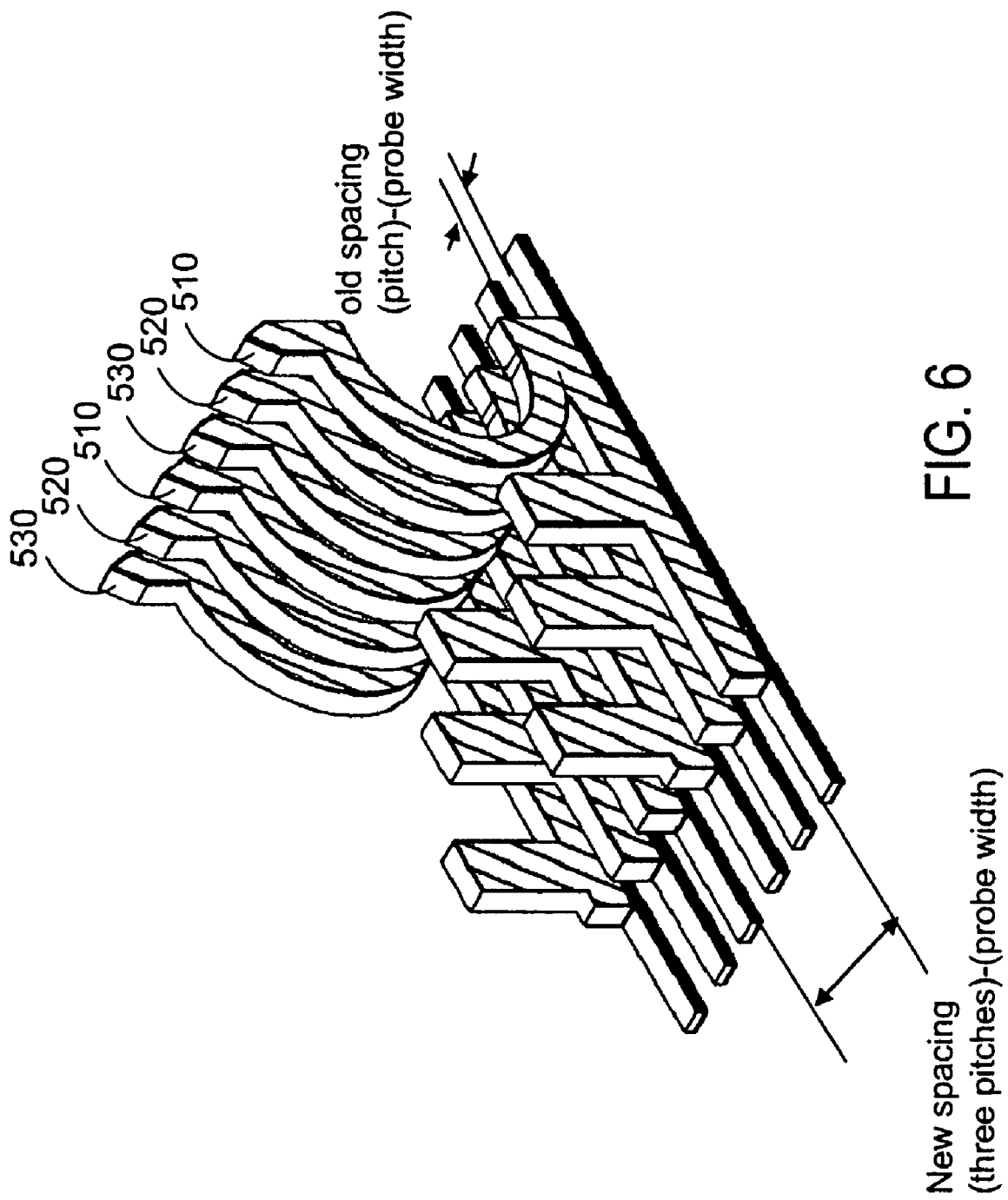
FIG. 6 illustrates an embodiment of a probe array assembly using the three probes of FIG. 5.

More than two different probe base designs can be used to provide even more spacing for tool handling. FIG. 5 illustrates another embodiment in which the effective spacing between the adjacent probes can be further increased with probes that have gripping handles at three different locations on the probe bases. A set of three probes 510, 520 and 530 are shown. Each probe has a probe base (511, 521 and 531) that includes a gripping handle (512, 522 and 532) at different locations relative to the proximal end of the associated probe base (the end that is connected to the spring). The lengths of probe bases (511, 521 and 531) can be the same or different. When interleaving multiple probes 510, probes 520 and probes 530 on a platform, as shown in FIG. 6, the effective spacing between the adjacent probes is increased to (three pitches)−(probe width). A person of ordinary skill in the art can understand that more than three different kinds of probes can be interleaved to further increase the effective spacing.

Figure 7:
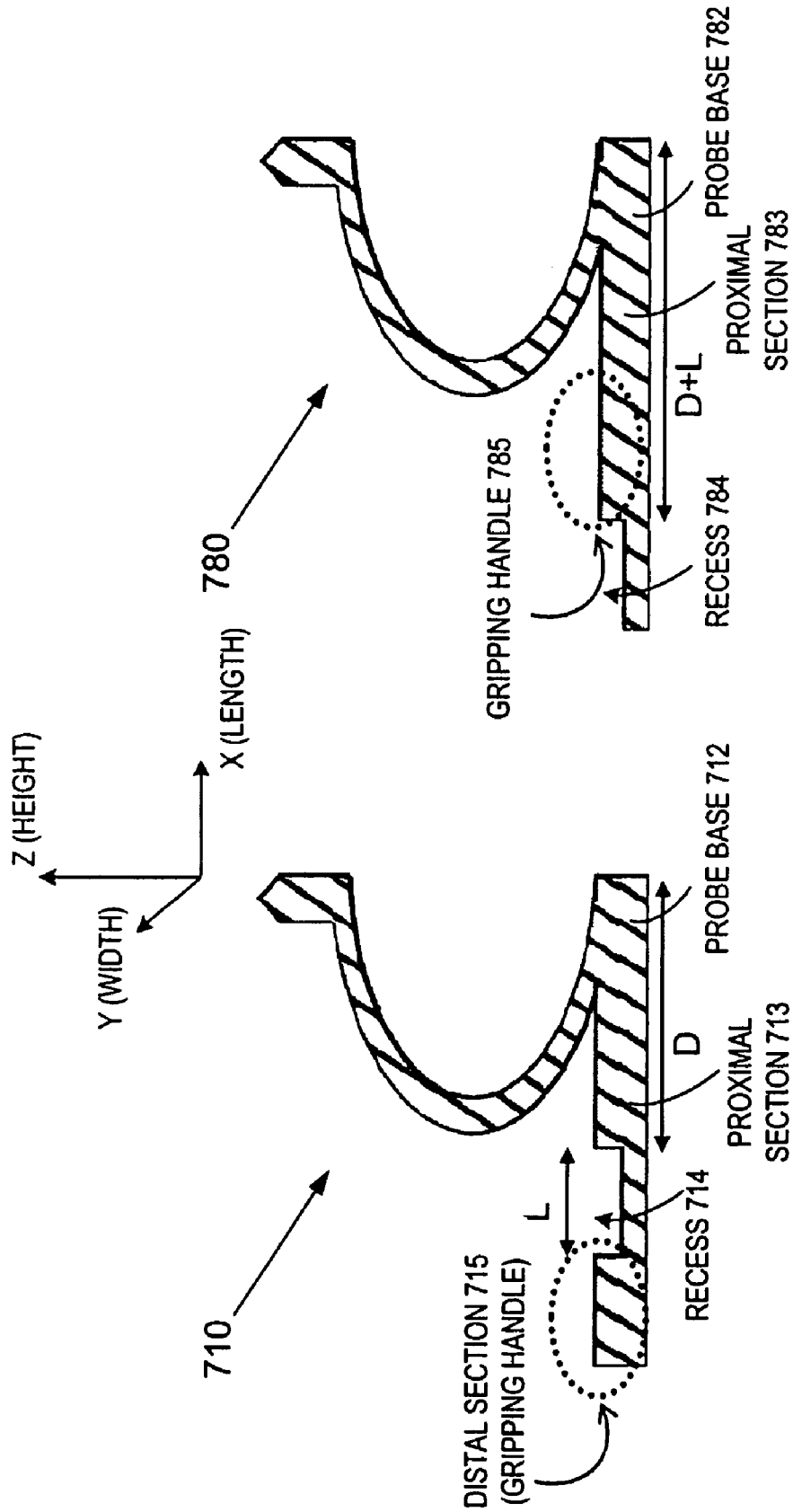
FIG. 7 illustrates an embodiment of two probes that have recesses in different locations of the probe bases.
Figure 8:
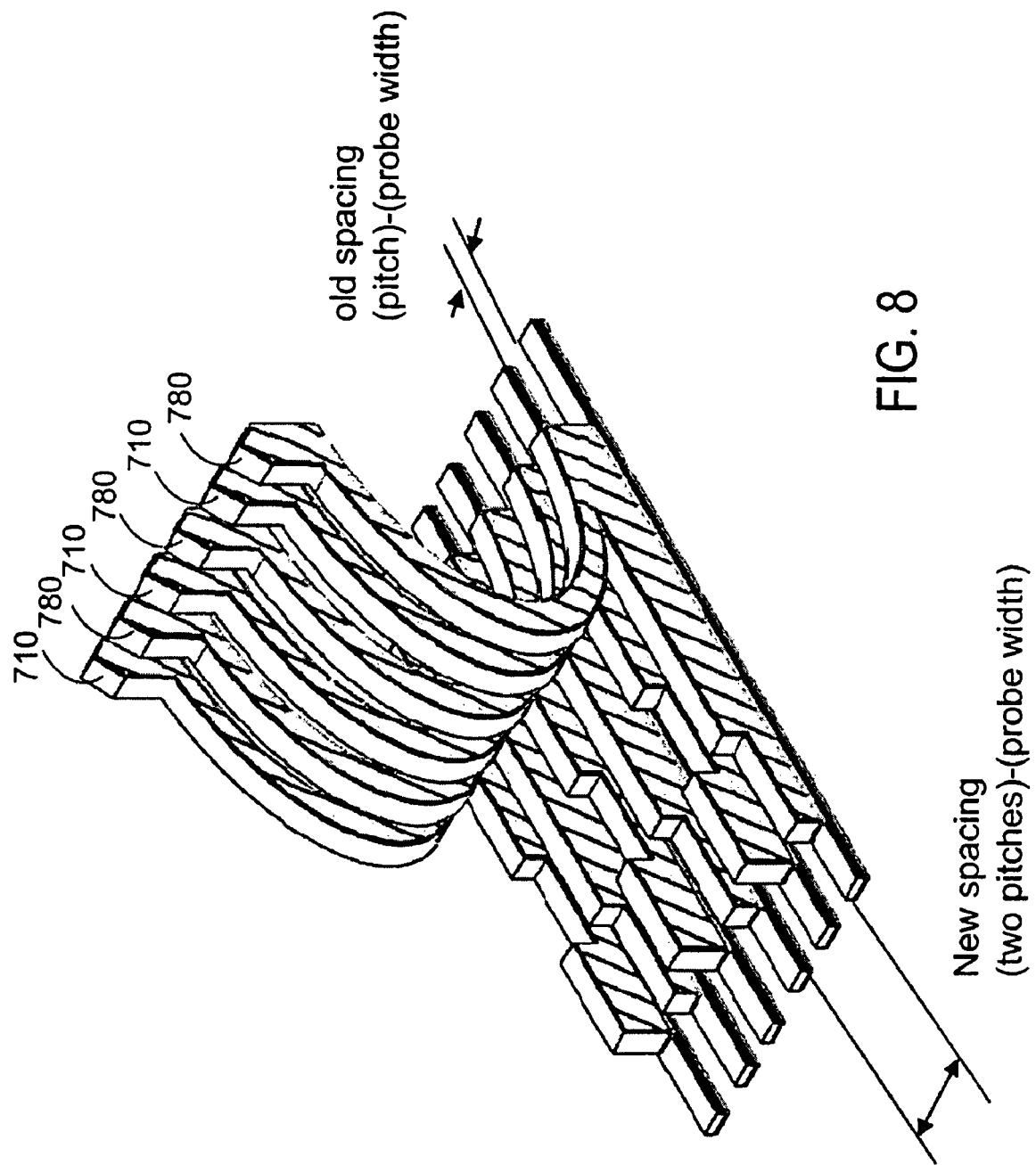
FIG. 8 illustrates an embodiment of a probe array assembly using the two probes of FIG. 7.

FIG. 7 illustrates yet another embodiment of probes 710 and 780, with different recess locations on the top side (as viewed) of the probe bases. Probe 710 has a probe base 712, which includes a proximal section 713 of length D, a recess 714 of length L and a distal section 715. Recess 714 is relatively lower (in height) than the height(s) of proximal section 713 and distal section 715. Probe 780 has a probe base 782 including a proximal section 783 of length (D+L) and a recess 784 at the distal end. The lengths of recesses 714 and 784 can be the same or different. When multiple probes 710 and probes 780 are interleaved on a platform, each probe can be grabbed by its probe base where its immediately-adjacent probes on both sides have recesses. That is, distal section 715 of probe 710 and at least a portion of proximal section 783 (gripping handle 785) of probe 780 can be used as gripping handles for the respective probes. FIG. 8 shows an example of a probe assembly having interleaved probes 710 and 780. By grabbing a probe by its probe base where its immediately-adjacent probes on both sides have recesses, the assembly can have a larger effective spacing equal to (two pitches)−(probe width). Similar to the arrangement shown in FIG. 6, the effective spacing of FIG. 8 can be further increased by interleaving probe bases having recesses in more than two different locations.

A person of ordinary skill in the art would understand that the embodiments described above are merely illustrative. Other probe base designs can be used to provide the effective spacing increase for tooling but still within the same spirit of above concept.

The following description provides one embodiment of a process for fabricating the probes described above. Although only one probe is shown in the following figures, it is understood that the same process can be applied to the fabrication of multiple probes having probe bases of different shapes. These multiple probes having probe bases of different shapes can be fabricated at the same time (in the same batch) on the same wafer. For example, a single mask can be drawn by software to define the shapes (in the X-Z plane) of the probes that have probe bases of different shapes. The probes assembled on the same application platform may be from the same wafer or different wafers.

Referring to FIGS. 9-15, an embodiment of a process for fabricating a MEMS probe on a substrate is shown in both perspective views and cross-section views. All of the figures labeled with "A" show perspective views, and all of the figures labeled with "B" show cross-section views. Some standard or routine processing operations that are not directly relevant to the subject matter of the present invention, but are easily understood by a person of ordinary skill in the art, may be omitted from the following descriptions.

The probes fabricated by the process to be described below are formed in a "lying" position, which means that the probe bodies are lying on a plane parallel with the surface of the substrate. Each probe is detached from the substrate by forming an undercut beneath the probe and breaking the probe base from an anchoring structure on the substrate. Each probe is then attached to an application platform of a probe card. During the attachment process, the probe is lifted up to a "standing" position such that only the probe base of the probe body is attached to the application platform.

Figure 9B:
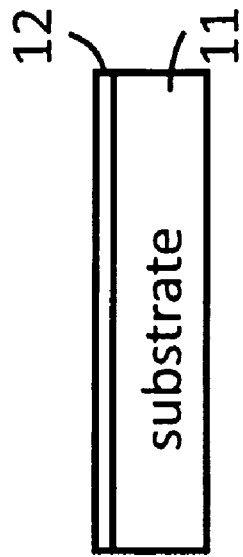
FIGS. 9A-9B illustrate a perspective view and a cross-section view of a substrate on which a conductive layer is formed for fabricating a probe.
Figure 10:
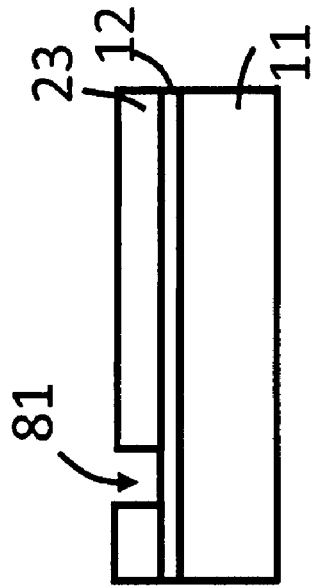
FIGS. 10A-10B illustrate an opening formed in a first sacrificial layer.
Figure 9A:
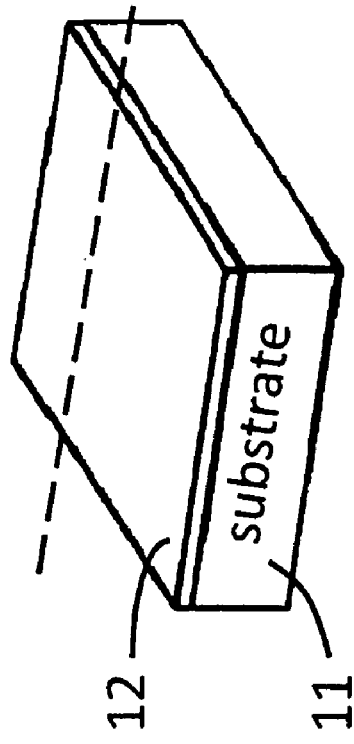
Figure 10:
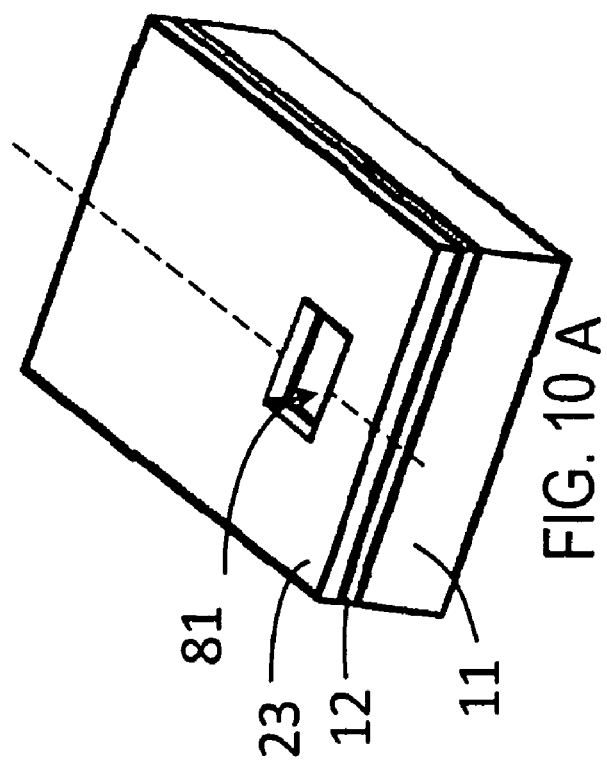

FIGS. 9A and 9B show a blanket metal layer 12 (e.g., gold or other conductive material(s)) formed on a substrate 11. To improve adhesion to substrate 11, in one embodiment, the bottom of blanket metal layer 12 may be coated with a thin film (e.g., less than 1 micron, not shown), also referred to as a seed layer, that is made of a conductive material (e.g., a combination of chromium and gold) different from that of blanket metal layer 12. In one embodiment, blanket metal layer 12 is deposited by an electrical forming process (also know as electrodeposition), such as electrode plating. The seed layer is formed by a thin film deposition process, which can be thermal evaporation, e-beam evaporation, sputtering deposition, or the like.

In FIGS. 10A and 10B, after blanket metal layer 12 is formed on substrate 11, a photoresist pattern of an opening 81 is formed before a first sacrificial layer 23 is electrically formed. First sacrificial layer 23 is a layer of metal (e.g., copper) or alloy, different from blanket metal layer 12 and the probe to be formed on substrate 11. One way to form first sacrificial layer 23 is by electrical forming. In subsequent processing operations to be described below, first sacrificial layer 23 is to be removed from beneath the probe. In some embodiments, first sacrificial layer 23 may be planarized before further processing operations are performed. Planarization may be performed by a machine, such as a lapping machine, a diamond fly-cutter, or the like.

After first sacrificial layer 23 is formed, the photoresist is stripped to expose, through opening 81, blanket metal layer 12 or the thin film (i.e., the seed layer, not shown) at the bottom of blanket metal layer 12. A first lithographic patterned mold (e.g., a photoresist mold, not shown) is used to define the shape of tip base 34 and frame 92 (FIGS. 11A and 11B). The first lithographic patterned mold is placed on first sacrificial layer 23 and filled, by electrical forming, with a metal (e.g., nickel) or alloy material. The first lithographic patterned mold is to be removed in a subsequent processing operation, e.g., after tip base 34, the contact tip of the probe, or the probe is formed.

Frame 92 has direct contact with blanket metal layer 12 or the seed layer at the bottom of blanket metal layer 12. In one embodiment, frame 92 and tip base 34 are formed, by electrical forming, for the same period of time. Thus, the thickness of tip base 34 and frame 92 is substantially the same. As the side area of frame 92 is formed on top of first sacrificial layer 23 and the center area of frame 92 is formed on top of blanket metal layer 12 or the seed layer of blanket metal layer 12, the center area of frame 92 forms a recess 93. In some embodiments, recess 93 may be removed by planarization.

FIGS. 12A and 12B show that contact tip 45 is formed on top of probe base 34, with a portion of contact tip 45 protruding from tip base 34. In one embodiment, contact tip 45 is formed by using a second lithographic patterned mold (e.g., a photoresist mold, not shown) to define the shape of contact tip 45. The second lithographic patterned mold is filled, by electrical forming, with a metal (e.g., rhodium) or alloy material different from the material of tip base 34. The second lithographic patterned mold is also to be removed in a subsequent processing operation, e.g., after contact tip 45 or the probe is formed.

As shown in FIGS. 12A-12B and 13A-13B, after the formation of tip base 34 and contact tip 45, the rest of the probe and frame 92 are formed on substrate 11. In an embodiment where both tip base 34 and the probe 51 (excluding contact tip 45) are formed by the same material (e.g., nickel), tip base 34 becomes part of probe 51 and is not explicitly shown in the following figures.

FIGS. 13A and 13B show a probe 51 formed with frame 92 attaching to the probe. A third lithographic patterned mold (not shown) may be used to form probe 51 (excluding tip base 34 and contact tip 45) and frame 92. The third lithographic patterned mold is filled, by electrical forming, with a conductive material, such as a metal (e.g., nickel) or alloy. In some embodiments, the first, second and third lithographic patterned molds may be made of the same materials, such as photoresist, or different materials.

The third lithographic patterned mold also defines the shape of an anchoring joint 52 between a probe base 58 and frame 92. Anchoring joint 52 is shaped to have deep V-cuts on both sides of the joint section that connects probe base 58 and frame 92. The cross-section of anchoring joint 52 (defined by a plane that cuts through the joint section of probe base 58 and frame 92) is a thin and narrow area. For example, anchoring joint 52 is shaped to have deep V-cuts on both sides, such that its cross-section has substantially the shape of a line, which extends along the thickness of the probe layer. The shape of anchoring joint 52 facilitates the detachment of probe 51 from frame 92 by external force.

Frame 92 at this point is anchored to blanket metal layer 12 or the seed layer at the bottom of blanket metal layer 12. On substrate 11, probe 51 is formed in a "lying" position, which means that probe 51 is lying on a plane parallel with the surface of substrate 11. FIG. 13B shows the cross-section view of probe 51 along axis (I) and axis (II). In the "lying" position, a thickness dimension, t, of probe 51 is shown to be perpendicular to the surface of substrate 11. Axis (I) extends along the longitudinal direction of an elongated section of probe 51, referred to as probe base 58. A surface of probe base 58, referred to as a bonding surface 59, lies on a plane along the thickness dimension and is perpendicular to the surface of substrate 11. Axis (II) extends from probe base 58 to contact tip 45 and is parallel with the surface of substrate 11. This "lying" position is opposed to a "standing" position when probe 51 is attached to an application platform of a probe card. In the "standing" position, bonding surface 59 is attached to the surface of the application platform, while contact tip 45 is lifted up such that axis (II) goes through the surface of the application platform.

Additional processes may be performed to apply a metal thin film (e.g., gold) to bonding surface 59 of probe base 58 for the purpose of improving adhesion between probe base 58 to the surface of the platform of the probe card.

Figure 14B:
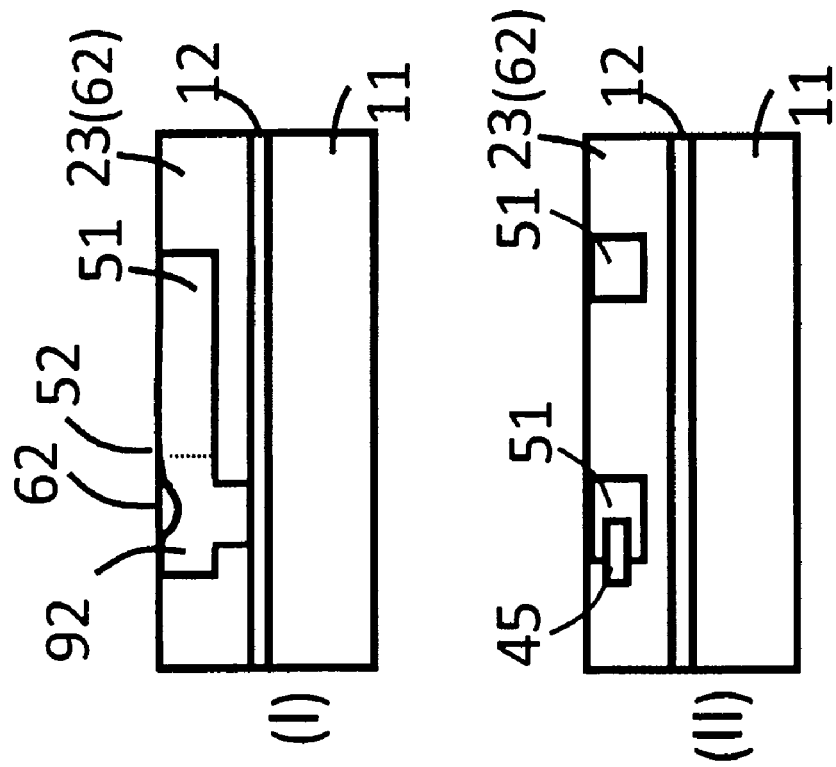
FIGS. 14A-14B illustrate a planarization process.
Figure 14A:
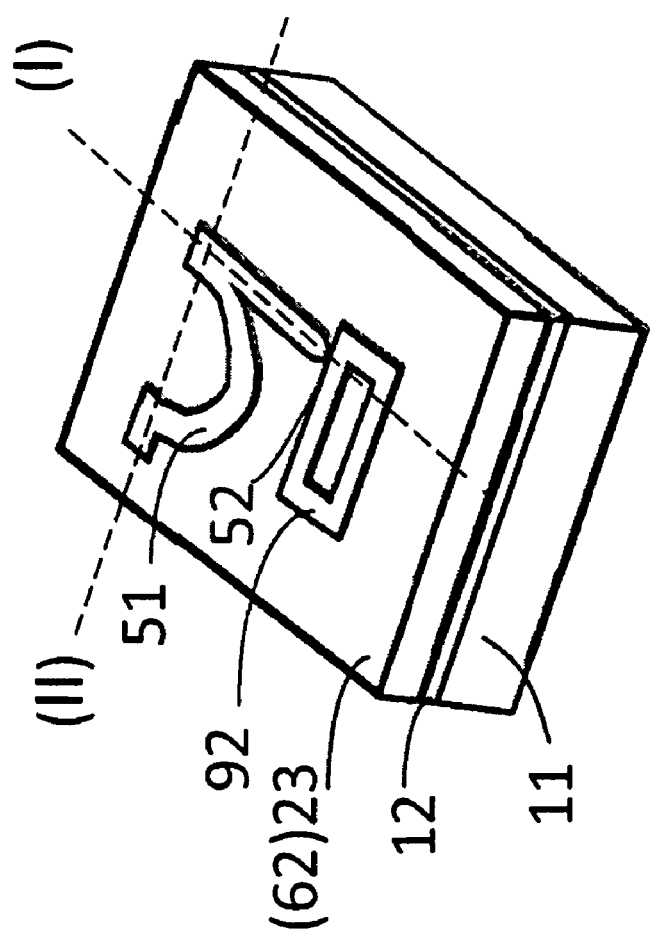
Figure 15B:
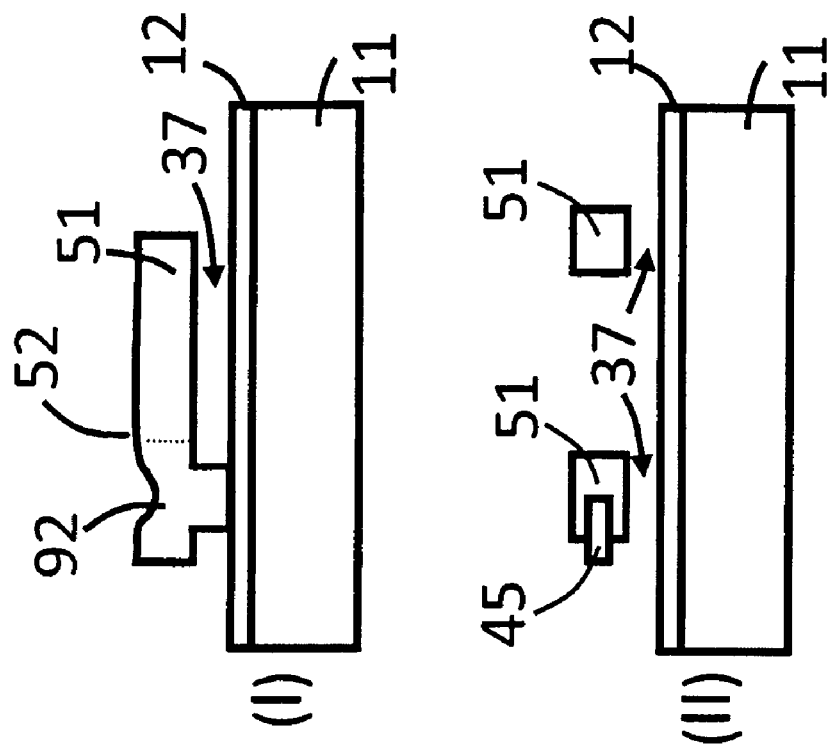
FIGS. 15A-15B illustrate the removal of the first sacrificial layer.
Figure 15A:
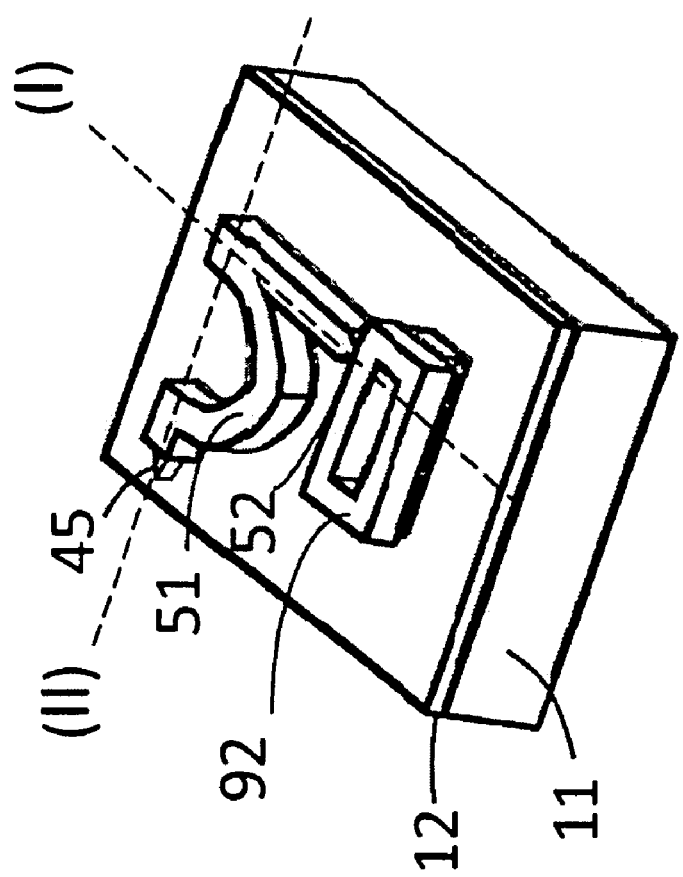

FIGS. 14A and 14B show the planarization of the probe surface with the use of second sacrificial layer 62, which, in this embodiment, is made of the same material as first sacrificial layer 23. Alternatively, second sacrificial layer 62 may be made of photoresist, or the same material as any of the previously-applied lithographic patterned molds. After the planarization, first sacrificial layer 23 and second sacrificial layer 62 are removed, e.g., by chemical etching or dissolving (FIGS. 15A and 15B). The etching or dissolving time can be performed until all of the sacrificial material is etched or dissolved. As frame 92 is anchored to blanket metal layer 12 or the seed layer at the bottom of blanket metal layer 12, complete removal of first sacrificial layer 23 does not create a problem. The removal of first sacrificial layer 23 creates an undercut 37 beneath probe 51.

In one embodiment, a thin metal film (e.g., gold) may be deposited on bonding surface 59, at this point instead of before the planarization operation, for the purpose of improving adhesion between probe base 58 to the surface of the application platform.

Probe 51 can be detached from frame 92 by applying a physical force at or near anchoring joint 52 manually or with a machine. Substrate 11 can be reused after frame 92 is etched or dissolved away.

The detachment of probe 51 can be performed by external force at or near anchoring joint 52, with respect to the surface of substrate 11. The external force, either laterally or upward, or by laser cutting, physically breaks the narrow connection at anchoring joint 52. After the narrow connection is broken, a "broken" surface is formed at a distal end of probe base 58, which is the side of probe base 58 that was previously connected to frame 92. This broken surface is distinguishable from a surface defined by conventional methods of probe formation that does not use external force to detach a probe from the substrate. In general, a surface formed by conventional methods is smooth and regularly shaped. A surface formed by forcibly breaking (such as the broken surface of probe base 58) is generally rough and substantially irregular. A person of ordinary skill in the art would be able to recognize this "signature" represented by the broken surface by examining the smoothness and shape of the surface. In a scenario where probe 51 is made of metal, the roughness and irregularity of a broken metal surface is visually discernable and distinguishable from a plated metal surface defined by photoresist or other sacrificial materials.

Thus, a technique for arranging a probe assembly on a probe card platform has been described. It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. A probe array assembly comprising:
   a platform; and
   a plurality of probes on the platform, each probe comprising a probe base, a spring and a contact tip,
   wherein the probe base of each probe comprises an elongated member that extends longitudinally along a top surface of the platform, the elongated member having a top elongated surface facing the spring and a bottom elongated surface bonded to the top surface of the platform,
   wherein a first group of the probe bases on the platform have a first shape, each probe base having the first shape comprising a first gripping handle that rises from the top elongated surface of the elongated member,
   wherein the probe bases of the first shape having the first gripping handles are interleaved on the platform with the probe bases of one or more other shapes having corresponding gripping handles, the first gripping handles and the corresponding gripping handles form a staggered or zigzag pattern on the platform.

2. The probe array assembly of claim 1, wherein a second number of the probe bases on the platform have a second shape, each probe base having the second shape including a second gripping handle extending the probe base longitudinally toward a distal end of the probe base, wherein a first probe of the first group is placed next to a second probe of the second group, such that the springs of the first probe and the second probe align and the first gripping handle of the first probe does not align with the second gripping handle of the second probe.

3. The probe array assembly of claim 2, wherein the second gripping handle is lower than the first gripping handle on the platform and longer than the first gripping handle.

4. The probe array assembly of claim 1, wherein a second group of the probe bases on the platform have a second shape, each probe base having the second shape including a second gripping handle that rises perpendicularly from the top elongated surface of the elongated member, wherein a first probe of the first group is placed next to a second probe of the second group, such that the springs of the first probe and the second probe align and the first gripping handle of the first probe does not align with the second gripping handle of the second probe.

5. The probe array assembly of claim 1, wherein a distal end of each probe base has a broken surface that is formed by detaching the probes with force from a substrate on which the probes were fabricated.

6. The probe array assembly of claim 1, wherein effective spacing between the probes for a handling tool is two or more times a pitch minus probe width, the pitch equal to a distance between two immediately-adjacent probes.

7. The probe array assembly of claim 1, wherein the probe bases have two or more different lengths.

8. An apparatus comprising:
a probe card platform; and
a plurality of probes on the probe card platform, each probe comprising a spring, a contact tip and a probe base that comprises a gripping handle, wherein the springs of the probes are aligned on the probe card platform,
wherein the probe base of each probe comprises an elongated member that extends longitudinally along a top surface of the probe card platform, the elongated member having a top elongated surface facing the spring and a bottom elongated surface bonded to the top surface of the probe card platform,
wherein a first group of the probe bases on the probe card platform have a first shape, each probe base having the first shape comprising a first gripping handle that rises from the top elongated surface of the elongated member,
wherein the probe bases of the first shape having the first gripping handles are interleaved on the probe card platform with the probe bases of one or more other shapes having corresponding gripping handles, the first gripping handles and the corresponding gripping handles form a staggered or zigzag pattern on the probe card platform.

9. The apparatus of claim 8, wherein a second number of the probe bases on the probe card platform have a second shape, each probe base having the second shape including a second gripping handle extending the probe base longitudinally toward a distal end of the probe base, wherein a first probe of the first group is placed next to a second probe of the second group, such that the springs of the first probe and the second probe align and the first gripping handle of the first probe does not align with the second gripping handle of the second probe.

10. The apparatus of claim 8, wherein a second group of the probe bases on the probe card platform have a second shape, each probe base having the second shape including a second gripping handle that rises perpendicularly from the top elongated surface of the elongated member, wherein a first probe of the first group is placed next to a second probe of the second group, such that the springs of the first probe and the second probe align and the first gripping handle of the first probe does not align with the second gripping handle of the second probe.

11. The apparatus of claim 8, wherein the probe bases have two or more different lengths.

12. An apparatus comprising:
a platform; and
a plurality of probes on the platform, each probe comprising a spring, a contact tip and a probe base that comprises a recess and a gripping handle, wherein the springs of the probes are aligned and the recesses form a staggered or zigzag pattern on the platform,
wherein the probe base of each probe comprises an elongated member that extends longitudinally along a top surface of the platform, the elongated member having a top elongated surface facing the spring and a bottom elongated surface bonded to the top surface of the platform,
wherein the recess in the probe base sets back from the top elongated surface of a first portion of the elongated member, and the gripping handle is a second portion of the elongated member that is adjacent to the first portion,
wherein the probes having probe bases of different shapes are interleaved on the platform, such that a first probe base with a first recess is placed next to a second probe base with a second recess, the first recess and the second recess located at different locations in the first probe base and the second probe base, respectively.

13. The apparatus of claim 12, wherein a distal end of each probe base has a broken surface that is formed by detaching the probes with force from a substrate on which the probes were fabricated.

14. The apparatus of claim 12, wherein effective spacing between the probes for a handling tool is two or more times a pitch minus probe width, the pitch equal to a distance between two immediately-adjacent probes.

15. The apparatus of claim 12, wherein the probe bases of two or more shapes are interleaved on the platform, with each shape having the recess positioned at a different location of the probe base.

* * * * *